United States Patent
Smith et al.

(10) Patent No.: US 8,953,318 B1
(45) Date of Patent: Feb. 10, 2015

(54) PASSIVE COOLING SYSTEMS AND METHODS FOR ELECTRONICS

(75) Inventors: James E. Smith, Huntsville, AL (US); William Bishop, Huntsville, AL (US)

(73) Assignee: The Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 341 days.

(21) Appl. No.: 13/231,771

(22) Filed: Sep. 13, 2011

Related U.S. Application Data (60) Provisional application No. 61/382,261, filed on Sep. 13, 2010.

(51) Int. Cl.
H05K 7/20 (2006.01)

(52) U.S. Cl.
CPC .................. *H05K 7/2029* (2013.01)
USPC .............. 361/700; 165/104.33; 165/185

(58) Field of Classification Search
CPC .......... H05K 7/20218; H05K 7/20936; H05K 7/20836; H05K 7/2029
See application file for complete search history.

(56) References Cited

U.S. PATENT DOCUMENTS

| | | | | |
|---|---|---|---|---|
| 4,233,645 A * | 11/1980 | Balderes et al. | ............... | 361/698 |
| 4,312,072 A * | 1/1982 | Vogel | ............................. | 380/34 |
| 4,395,728 A * | 7/1983 | Li | .................................. | 257/715 |
| 5,589,114 A | 12/1996 | Evans | | |
| 7,369,440 B2 * | 5/2008 | Shappir et al. | ........... | 365/185.19 |
| 8,384,212 B2 * | 2/2013 | Otsuka et al. | .................. | 257/710 |
| 2005/0111188 A1 * | 5/2005 | Bhattacharya et al. | ....... | 361/699 |
| 2006/0034054 A1 | 2/2006 | Brasz et al. | | |
| 2006/0090881 A1 * | 5/2006 | Tuma | ....................... | 165/104.21 |
| 2007/0163765 A1 | 7/2007 | Rondier et al. | | |
| 2009/0032937 A1 | 2/2009 | Mann et al. | | |

OTHER PUBLICATIONS

Cairo University Faculty of Engineering, "Chapter 18, Immersion Cooling," MPE 635: Electronics Cooling, Part C: Electronics Cooling Methods in Industry, pp. 56-64, http://www.pathways.cu.edu.eg/ec/Text-PDF/Part%20C-18.pdf.

Buss, "battle of the elements: air vs. water CPU cooler showdown" Tech Report, http://techreport.com/review/16744/battle-of-the-elements-air-vs-water-cpu-cooler-showdown.

* cited by examiner

*Primary Examiner* — Gregory Thompson
(74) *Attorney, Agent, or Firm* — Maynard Cooper & Gale, P.C.; Jon E. Holland (57) ABSTRACT

Embodiments of the present disclosure generally pertain to passive cooling systems and methods for electronics. An exemplary passive cooling system for electronics has a circuit package and dielectric liquid. The circuit package has a cover positioned over a circuit element coupled to a substrate. The cover is attached to the substrate and creates a water-tight seal around the circuit element. The circuit package further has a porous media. The dielectric liquid directly contacts the circuit element, and heat from the circuit element is transferred to the dielectric liquid. As the liquid reaches its boiling point, vapor from the liquid is passed through the porous media for further cooling.

24 Claims, 7 Drawing Sheets

Section A-A

PASSIVE COOLING SYSTEMS AND METHODS FOR ELECTRONICS

CROSS REFERENCE TO RELATED APPLICATION

This application claims priority to U.S. Provisional Patent Application No. 61/382,261, entitled "Passive Heat Rejection for Cooling Electronics for Missile Applications" and filed on Sep. 13, 2010, which is incorporated herein by reference.

RELATED ART

Thermal management of electronic components is a challenging area of application for advanced heat transfer techniques. Such challenges arise due to smaller package sizes, concentration of electronic components in small areas on circuit boards, higher clocking speeds and lower voltage applications which complicate removal of the heat generated by the operation of electronic circuits. Failure to effectively transfer heat from the electronic components can result in damage to the components due to overheating. Furthermore, overheating of electrical connections can also occur. The problem of transferring large heat fluxes while maintaining temperature within operating limits of the electronic components arises in a wide variety of applications, such as, for example, advanced semiconductor design, supercomputers, and military and aerospace electronics. Improved heat transfer techniques in such applications would prevent damage to the electronic components and increase their performance.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Embodiments of the present disclosure generally pertain to passive cooling systems and methods for electronics. An exemplary passive cooling system for electronics comprises a circuit package and dielectric liquid. The circuit package comprises a cover positioned over a circuit element residing on a substrate. The cover is attached to the substrate and creates a water-tight seal around the circuit element. The circuit package further comprises a porous media. The dielectric liquid directly contacts the circuit element, and heat from the circuit element is transferred to the dielectric liquid. As the liquid reaches its boiling point, a vapor from the boiling liquid passes through the porous media for further cooling.

Figure 1:
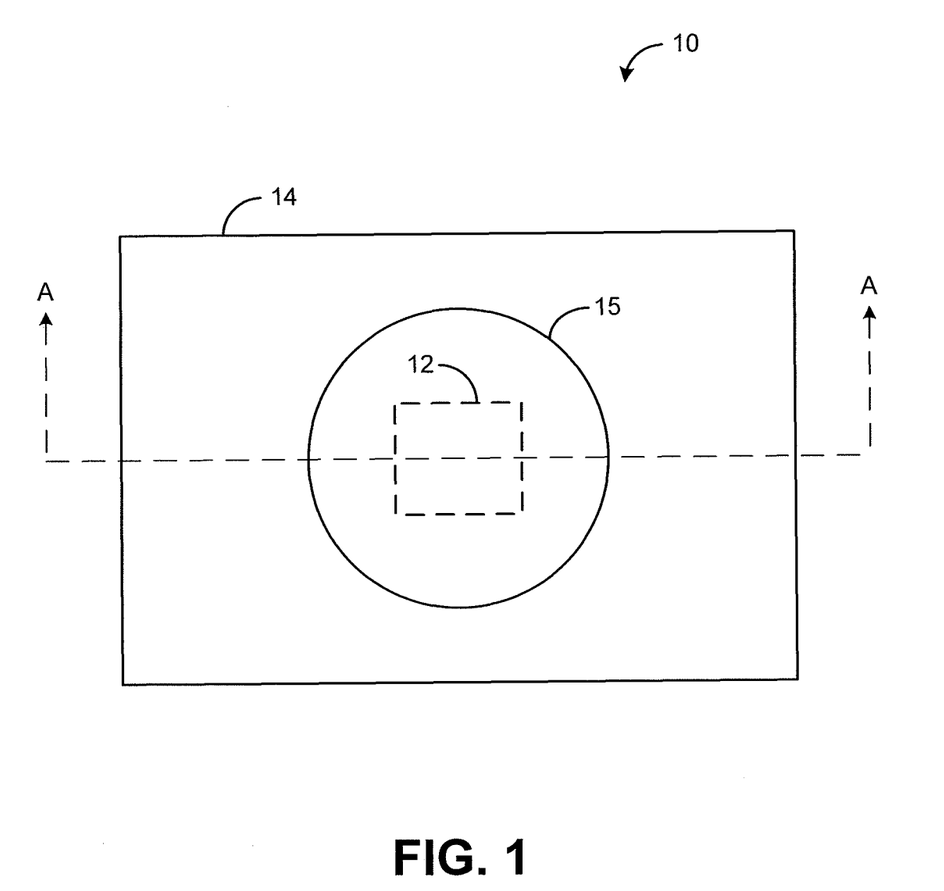
FIG. 1 is a top plan view of an exemplary electronic circuit package in accordance with the present disclosure.

FIG. 1 depicts a top view of an exemplary embodiment of an electronic circuit package 10. The package 10 comprises a circuit element 12 positioned upon a substrate 14. In one embodiment, the circuit element 12 comprises at least one integrated circuit (IC) chip comprising one or more electronic components (not shown) coupled by one or more electronic connections (not shown). The circuit element 12 may comprise any type of semiconductive material, such as, for example, silicon, gallium nitride, or gallium arsenide. However, other materials are possible in other embodiments. When in operation, the circuit element 12 generates heat which may damage one or more of the electronic components and/or the electronic connections of the IC chip. In one embodiment, the substrate 14 comprises a dielectric material, although other materials are possible in other embodiments.

The package 10 further comprises a cover 15 positioned over the circuit element 12. In one embodiment, the cover 15 comprises metal, although different materials are possible in other embodiments. The cover 15 is attached to the substrate 14 and creates a water-tight seal around the circuit element 12. In one embodiment, the cover 15 is soldered to the substrate 14, although other attachment methods are possible in other embodiments. Furthermore, in one embodiment, the cover 15 is generally cylindrical in shape, although other shapes are possible. The cover 15 contains a porous media (not shown in FIG. 1) and a dielectric liquid (not shown in FIG. 1), described in more detail hereafter, for passively cooling the circuit element 12.

Figure 2:
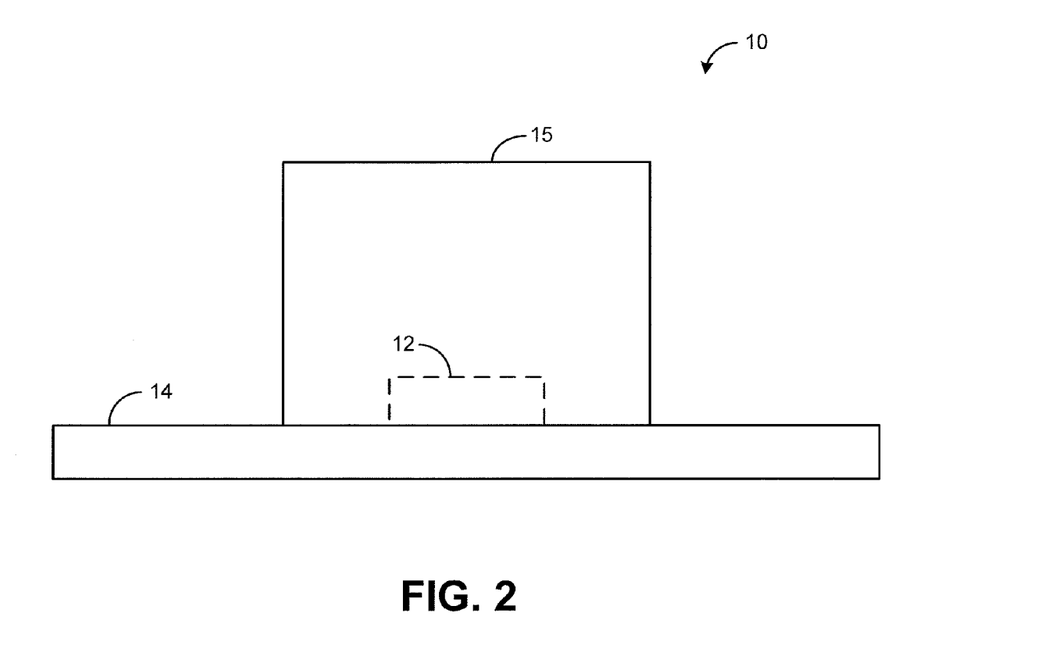
FIG. 2 is a side plan view of the exemplary electronic circuit package of FIG. 1.

FIG. 2 depicts a side view of the package 10 of FIG. 1. As shown by FIG. 2, the circuit element 12 is positioned upon the substrate 14. The cover 15 is positioned over the circuit element 12 and seals the circuit element 12 in an area between the substrate 14 and an inner surface of the cover 15. The cover 15 is attached to the substrate 14 and creates a water-tight seal such that liquid may not enter or exit the area within the cover 15 that houses the circuit element 12. Further, the cover 15 is dimensioned such that an inner diameter of the cover 15 is larger than a length of the circuit element 12 and the height of the cover 15 is greater than the height of the circuit element 12.

Figure 3:
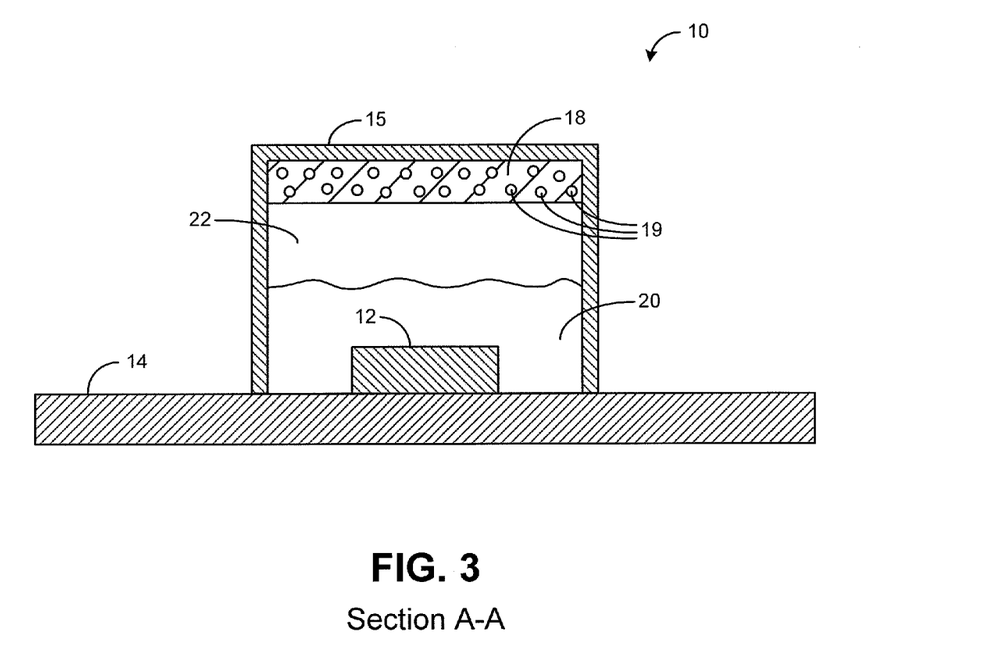
FIG. 3 is a cross-sectional view of the exemplary electronic circuit package of FIG. 1.

FIG. 3 depicts a cross-sectional view of the circuit package 10 of FIG. 1. As set forth above, the circuit package 10 comprises the circuit element 12, the substrate 14, and the cover 15. The circuit element 12 is positioned upon the substrate 14, and the cover 15 is positioned over the circuit element 12 and encloses the circuit element 12. The cover 15 is secured to the substrate 14, such as, for example, by soldering, although other methods of securing the cover 15 to the substrate 14 are possible in other embodiments.

The circuit package 10 further comprises a thermally conductive porous media 18. In one embodiment, the porous media 18 comprises a liquid phase sintered (LPS) porous frit, such as, for example, copper powder, although other materials are possible in other embodiments. As shown in FIG. 3, the porous media 18 is positioned within the cover 15 at a top of an inner surface of the cover 15. However, the porous media 18 may be positioned in different locations in other embodiments. The porous media 18 has a plurality of pores 19 throughout the media 18, discussed in more detail hereafter.

The circuit package 10 further comprises a liquid 20 positioned within the cover 15. The liquid 20 is preferably dielectric so that it does not conduct electrical current from the circuit element 12, which is in direct contact with the liquid 20, as will be described in more detail below. In one embodiment, the dielectric liquid 20 is injected into the cover 15 via a hypodermic needle (not shown), and the hole formed by the needle is thereafter plugged via soldering or otherwise, although other methods of placing the liquid 20 in the cover 15 are possible. The dielectric liquid 20 forms a pool and directly contacts the circuit element 12 in order to transfer heat away from the circuit element 12 and to increase the performance of the circuit element 12. The liquid 20 preferably has a boiling point below a temperature that will likely cause damage to the circuit element 12. In one embodiment, the dielectric liquid 20 comprises FLOURINERT FC-72 produced by the 3M Company. FLOURENERT FC-72 has a boiling point around 56 Celsius, which is suitable for many typical circuit elements 12. In other embodiments, other liquids having other boiling points selected based on the characteristics of the circuit element 12 are possible.

The dielectric liquid 20 contacts the circuit element 12 and an exposed portion of the substrate 14 within the cover 15. As the circuit element 12 produces heat, the heat is transferred to the dielectric liquid 20, and the liquid 20 transfers heat from the circuit element 12 to the substrate 14. Once the dielectric liquid 20 reaches its boiling point, portions of the liquid 20 begin to vaporize and travel upward towards the porous media 18. The size of the pores 19 in the media 18 allows the vapor to pass into the pores 19 to condense within the large surface area offered by the porous media 18. In this regard, the media 18 may be formed under pressure, which is used to control the pore sizes according to known LPS techniques. The size of the pores 19 is controlled to be large enough to accept vapor from the liquid 20 and permit condensed liquid 20 to be returned through the pores 19. Thus, the pores 19 receive the vapor, and the vapor transfers heat to the porous media 18. Once the vapor has sufficiently cooled and condensed into liquid form, the liquid 20 then drips back down out of the pores 19 into the pool of liquid 20 in order to continue cooling the circuit element 12. Accordingly, the circuit element 12 remains continuously cooled and can operate at levels at or above its performance specifications without overheating. Since many integrated circuits have self limiting thermal conditions, this added cooling permits them to operate well above this limitation. A self limiting LM317K voltage regulator was successfully tested using passive cooling and exceeded this limit by 25% compared to it nominal performance.

Note that the dielectric liquid 20 does not completely fill an inner chamber of the cover 15 but only partially fills the cover 15. Thus, the porous media 18 is separated from the pool of liquid 20 via a void 22. The void 22 provides adequate room within the cover 15 for the vaporized liquid 20 to travel upward to the porous media 18, condense, and drip back down into the pool of liquid 20. Furthermore, the amount of liquid 20 within the cover 15 is such that, if the circuit package 10 is tilted in any direction other than upside down, the liquid 20 still contacts at least a portion of the circuit element 12 thereby cooling the element 12. Also, the void 22 separates the liquid 20 from the porous media 18 helping to prevent the liquid 20 from inadvertently contacting the porous media 18 and filling the pores 19. In any orientation other than upside down, if inadvertent contact between the liquid and the media 18 occurs, the void 22 allows at least a portion of the media 18 to be exposed in order to allow the pores 19 to receive the vapor. Note that in other embodiments, such as the embodiments shown by FIGS. 4-7 discussed in more detail hereafter, the pores of the porous media may be dimensioned such that only the vapor passes through the pores and the liquid 20 is prevented from passing into the pores.

Figure 4:
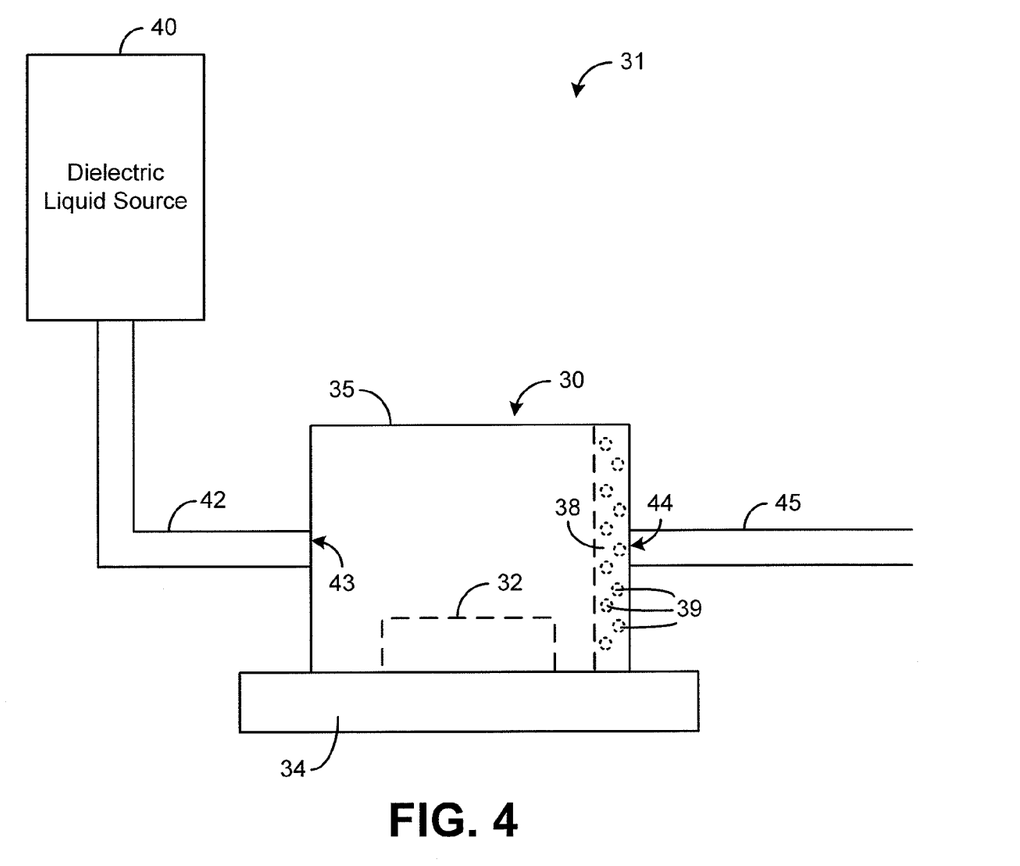
FIG. 4 is a side plan view of another exemplary embodiment of an electronic circuit package implemented in a dynamic cooling system.

FIG. 4 depicts another exemplary embodiment of a circuit package 30 implemented in a dynamic cooling system 31. The circuit package 30 comprises a circuit element 32 coupled to a substrate 34. As set forth above with respect to FIG. 1, in one embodiment, the circuit element 32 comprises at least one IC chip (not shown). The IC chip may comprise any type of semiconductive material, such as, for example, silicon, gallium nitride, or gallium arsenide. As set forth above, the circuit element 32 produces heat when in operation. The substrate 34 may comprise any suitable dielectric material. The package 30 further comprises a cover 35 positioned over the circuit element 32 and secured to the substrate 34, such as, for example, by soldering. The cover 35 has at least one inlet 43 and at least one outlet 44, discussed in more detail hereafter.

In one embodiment, the circuit package 30 further comprises a porous media 38 positioned within the cover 35. The porous media 38, as set forth above with respect to FIG. 3, comprises porous material having a plurality of pores 39. The pores 39 are dimensioned to allow vapor to pass through the porous media 38 while preventing liquid 20 (FIG. 3) from passing. The porous media 38, such as, for example, LPS porous frit, is positioned on an inner surface of the cover 35 over the outlet 44, discussed in more detail hereafter. While the porous media 38 of FIG. 4 is positioned over the outlet 44, the porous media 38 may be positioned in other locations in other embodiments, discussed in more detail hereafter. As an example, depicted in FIG. 5, the porous media 38 may be positioned within output tubing 45 and block the flow of liquid 20 through the tubing 45.

Referring again to FIG. 4, the cooling system 31 comprises the circuit package 30 coupled to a dielectric liquid source 40 via input tubing 42. The input tubing 42 extends from the inlet 43 of the cover 35. The cooling system 31 further comprises output tubing 45 coupled extending from the outlet 44 of the cover 35. In one embodiment, the input tubing 42 and the output tubing 45 comprise stainless steel, although other materials are possible in other embodiments. The input tubing 42 transports dielectric liquid 20 (FIG. 3) from the liquid source 40 to the circuit package 30. The liquid 20 travels into the cover 35 from the liquid source 40 via the tubing 42, and the liquid 20 contacts the circuit element 32 in order to transfer heat from the circuit element 32 to the liquid 20. The cover 35 forms a water-tight seal around the circuit element 32 such that liquid may not enter or exit the package 10 in places other than the inlet 43 or the outlet 44.

Heat is transferred from the circuit element 12 to the dielectric fluid 20 causing the fluid 20 to boil and vaporize. As the fluid 20 is continuously fed into the cover 35 via the input tubing 42, the fluid 20 forces the vapor towards the porous media 38. The pores 39 in the porous media 38 are dimensioned to receive the vapor but not the liquid 20. Thus, vapor travels through the porous media 38, out the outlet, and out the output tubing 45 where it is discarded from the system 31. Furthermore, the liquid 20 remains in the cover 35 until it boils and vaporizes, at which point it may travel through the pores 39 and be discarded from the system 31 via the output tubing 35. Thus, the porous media 38 maintains the liquid 20 within the cover 35 until the liquid 20 vaporizes thereby optimizing heat transfer by only discarding liquid 20 which has reached its boiling point. Further, liquid 20 is continuously fed through the input tubing 42 so that the circuit element 32 constantly remains immersed in the liquid 20. Although the porous media 38 is depicted within the cover 35 in FIG. 4, the media 38 may be positioned in different locations, such as, for example, within the output tubing 45 in other embodiments.

The system 31 set forth in FIG. 4 is a flow-through cooling system wherein the liquid 20 is continuously fed through the circuit package 30 from the liquid source 40. Heat is transferred from the circuit element 32 to the liquid 20 until the liquid 20 vaporizes and is discarded. Such system 31 is particularly suitable for temporary applications, such as, for example, missile applications, discussed in more detail hereafter.

Figure 5:
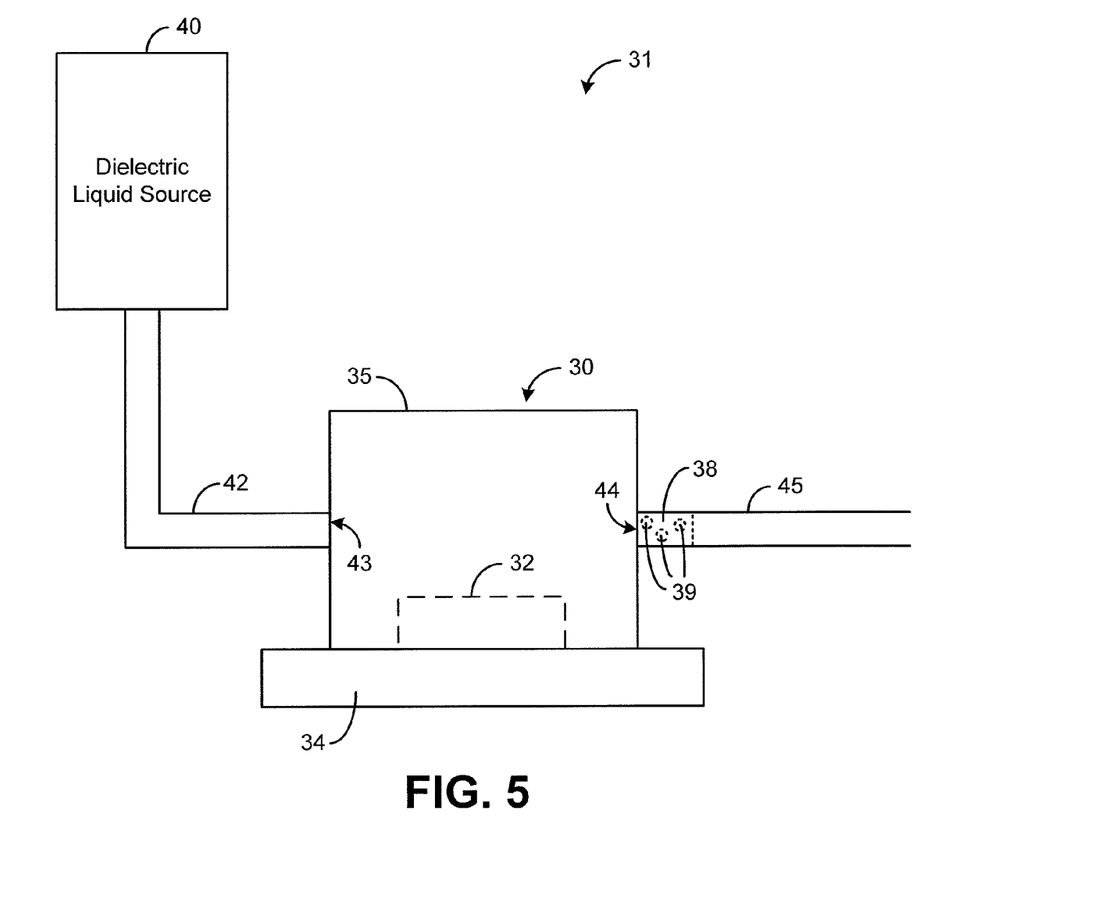
FIG. 5 is a side plan view of the dynamic cooling system of FIG. 4 with the porous media positioned within the output tubing.

FIG. 5 depicts another embodiment of the dynamic cooling system 31 of FIG. 4. As shown in FIG. 5, the dynamic cooling system 31 comprises the porous media 38 positioned within the output tubing 45. The porous media 38 blocks the flow of the liquid 20 (FIG. 3) from the cover 35 and only allows the vapor (not shown) to pass through the output tubing 45. Although the porous media 38 depicted in FIG. 5 is adjacent to the outlet 44, the porous media 38 may be positioned in any location along the length of the output tubing 45 to prevent the liquid 20 from exiting the tubing 45.

Figure 6:
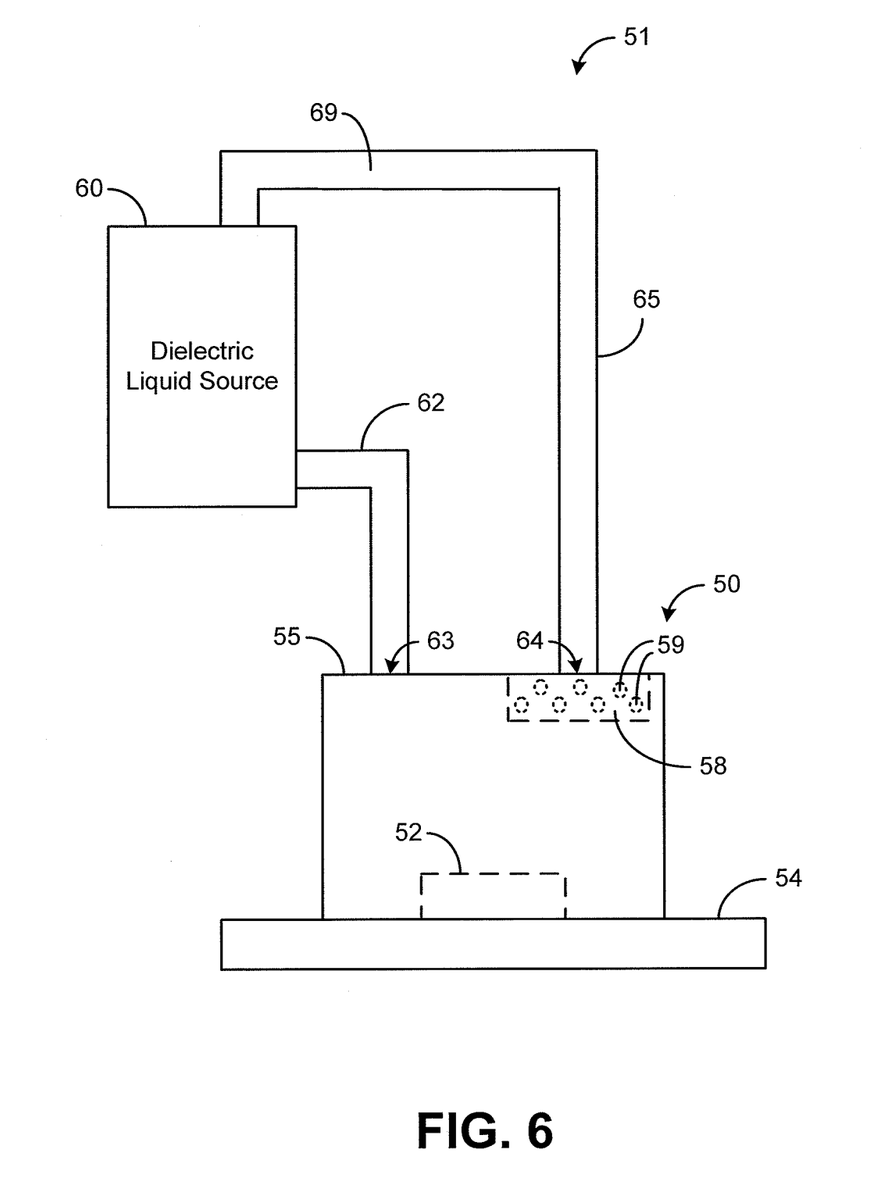
FIG. 6 is a side plan view of another exemplary embodiment of an electronic circuit package implemented in a passive cooling system.

FIG. 6 depicts another exemplary embodiment of a circuit package 50 implemented in a passive cooling system 51. The circuit package 50 of FIG. 6 is similar to the circuit package 10 (FIG. 1) and the circuit package 30 (FIG. 4) in that the circuit package 50 comprises a circuit element 52 coupled to a substrate 54 with a cover 55 positioned over the circuit element 52 and coupled to the substrate 54. The cover 55 has an inlet 63 and an outlet 64. The inlet 63 allows dielectric fluid 20 (FIG. 3) to flow into the cover 55, and the outlet 64 allows vapor to exit the cover 55. The circuit package 50 further comprises a porous media 58 positioned over the outlet 64 within the cover 55. The porous media 58 is configured similarly to the porous media 38 set forth above with respect to FIG. 4. The porous media 58 has a plurality of pores 59 for receiving vapor, and the pores 59 are dimensioned such that the liquid 20 may not enter the pores 59. Thus, only the vapor from the liquid 20 may travel through the porous media 58.

The passive cooling system 51 further comprises a dielectric liquid source 60 coupled to the circuit package 50 via input tubing 62. Liquid 20 from the source 60 passes through the input tubing 62 and enters the cover 55 through the inlet 63. As shown in FIG. 6, in one embodiment, the liquid source 60 is positioned higher than the circuit package 50, and the inlet 63 is positioned in a top of the cover 55 such that gravity pulls the liquid 20 through the input tubing 62 down into the cover 55. However, different orientations are possible in other embodiments. The passive cooling system 51 further comprises output tubing 65 extending from the outlet 64 of the cover 55 to the dielectric liquid source 60. The output tubing 65 is configured to receive vapor traveling through the porous media 58 from the cover 55 and to cool the vapor such that the vapor condenses into liquid 20. As shown in FIG. 6, the output tubing 65 is coupled to a top of the cover 55 and a top of the liquid source 60 such that vapor traveling upwards is received by the tubing 65 and condensed liquid 20 is fed down into the liquid source 60 due to gravity. However, different orientations are possible. Furthermore, in one embodiment, the input tubing 62 and the output tubing 65 comprise stainless steel, although other materials are possible in other embodiments.

The liquid 20 is continuously fed from the liquid source 60 to the circuit package 50. The liquid 20 enters the cover 55 via the inlet 63 and directly contacts the circuit element 52. Heat is transferred from the circuit element 52 to the liquid 20. Once the liquid 20 reaches its boiling point, portions of the liquid 20 are converted to vapor which rises upward within the cover 55. The pores 59 of the porous media 58 receive the vapor and allow the vapor to exit the cover 55 and travel up the output tubing 65. Heat is transferred from the vapor to the output tubing 65, and the vapor condenses into liquid 20 in an upper portion 69 of the tubing 65. The liquid 20 is then fed back into the liquid source 60 from the upper portion 69 of the output tubing 65 where it may be recycled through the cooling system 51 to continuously cool the circuit element 52.

Note that the liquid 20 in the cooling system 51 is reused for cooling the circuit element 52, much like the liquid 20 in the circuit package 10 is reused for cooling the circuit element 12. However, such reuse of the liquid 20 differs from the cooling system 31 of FIG. 4, wherein the liquid 20 is discarded after use. Thus, the cooling system 51 set forth in FIG. 6 is suitable for more long term, steady-state applications, such as, for example, cooling components of process control computer systems, while the cooling system 31 of FIG. 4 is suitable for short-term applications such as, for example, cooling components of missile systems.

Figure 7:
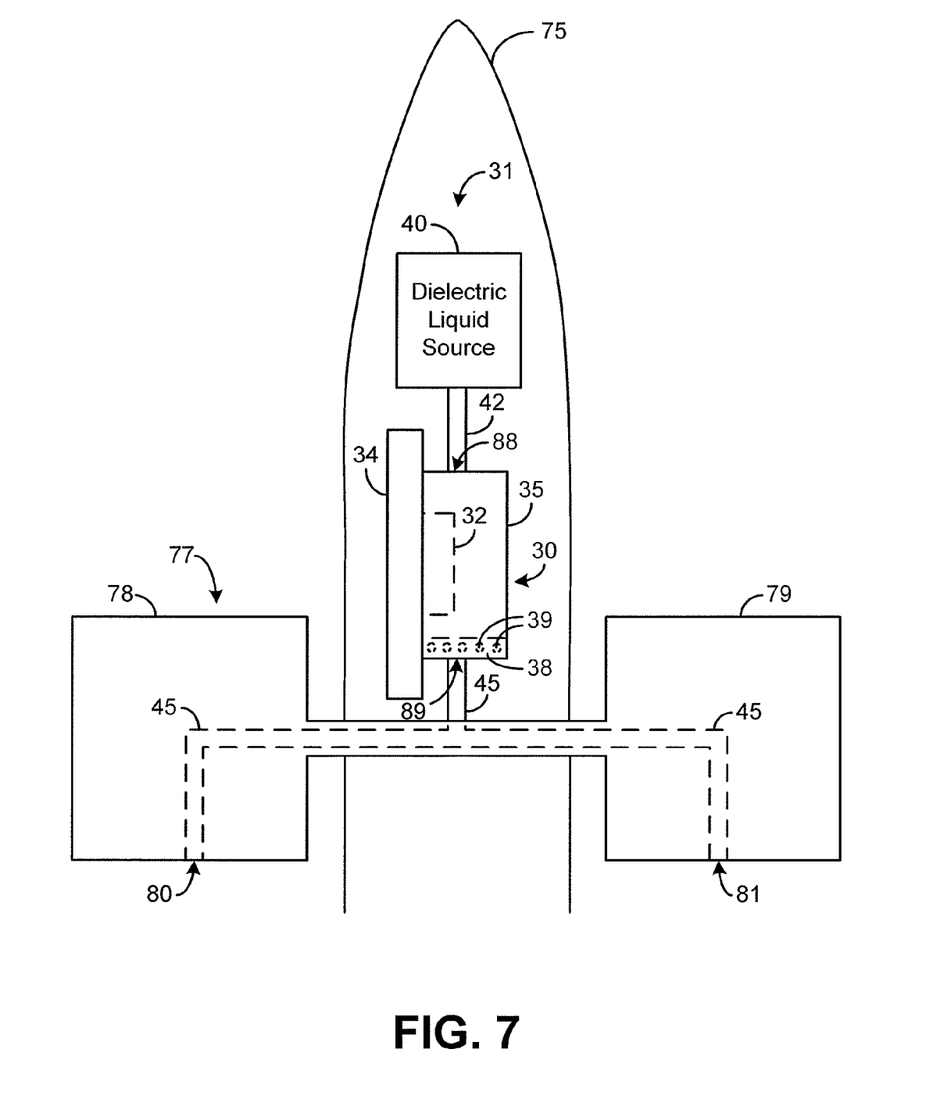
FIG. 7 is a side plan view of the dynamic cooling system of FIG. 4 implemented in a missile.

FIG. 7 depicts the cooling system 31 of FIG. 4 implemented in a missile 75. The missile 75 comprises a steering system 77 having a right steering fin 78 and a left steering fin 79. Each steering fin 78 and 79 comprises a respective non-propulsive vent 80 and 81, discussed in more detail hereafter. The missile 75 further comprises the cooling system 31. As set forth above, the cooling system 31 comprises the dielectric liquid source 40, the circuit package 30, the input tubing 42, and the output tubing 45. The circuit package 30 comprises the circuit element 32 coupled to the substrate 34, and also comprises the cover 35 positioned over the circuit element 32 and secured to the substrate 34. The cover 35 has an inlet 88 and an outlet 89, and the circuit package 30 also comprises the porous media 38 positioned over the outlet 89 within the cover 35. However, the media 38 may be positioned in different locations, such as, for example, within the output tubing 45, in other embodiments.

The dielectric liquid source 40 is coupled to the outlet of the cover 35 via the input tubing 42, and the dielectric liquid source 40 is configured to contain and distribute the dielectric liquid 20 (FIG. 3). The output tubing 45 is coupled to the outlet of the cover 35, and the output tubing 45 extends through the steering system 77 to the non-propulsive vents 80 and 81 in the left and right steering members 78 and 79, respectively.

When the missile 75 is launched, the dielectric liquid 20 is pressurized and pushed from the liquid source 40 to the cover 35 through the input tubing 42. When the liquid 20 enters the cover 35, the liquid 20 directly contacts the circuit element 32 in order to allow heat to pass from the element 32 to the liquid 20. Once a sufficient amount of heat is transferred to the liquid 20, the liquid 20 vaporizes. The liquid 20 does not pass through the pores 39 of the porous media 38, but the vapor passes through the pores 39 and is transferred to the output tubing 45 through the outlet of the cover 35. The vapor then travels through the tubing 45 and is discarded from the missile 75 via the vents 80 and 81.

Due to the short lifespan of the missile 75 from launch until detonation, the liquid 20 does not need to be reused by the cooling system 31 in order to adequately cool the circuit element 32. Thus, the vapor may be discarded from the missile 75 without adversely impacting the operation of the circuit element 32. Accordingly, the circuit element 32 functions properly without overheating, and the payload on the missile 75 is minimized.

Now, therefore, the following is claimed:
1. A cooling system for electronics, comprising:
a substrate;
a circuit element coupled to the substrate;
a cover positioned over the circuit element such that the circuit element is enclosed by the cover and the substrate, the cover attached to the substrate such that a water-tight seal is formed between the substrate and the cover;

dielectric liquid positioned within the cover, the dielectric liquid contacting the circuit element;

input tubing coupled to the cover; and output tubing coupled to the cover, wherein the dielectric liquid enters the cover through the input tubing, and wherein vapor from the dielectric liquid exits the cover through the output tubing.

2. The cooling system of claim 1, wherein the substrate comprises dielectric material.

3. The cooling system of claim 1, further comprising a dielectric liquid source coupled to the input tubing and the output tubing, wherein the vapor condenses into the liquid within the output tubing, and wherein the liquid flows back into the dielectric liquid source from the output tubing.

4. The cooling system of claim 1, wherein the output tubing discards the vapor.

5. The cooling system of claim 1, further comprising a porous media having a plurality of pores dimensioned to receive vapor from the dielectric liquid, the porous media positioned such that vapor from the dielectric liquid is received by the pores when the dielectric liquid boils.

6. The cooling system of claim 1, wherein the circuit element comprises an integrated circuit chip.

7. A cooling system for electronics, comprising:

a substrate;

a circuit element coupled to the substrate;

a cover positioned over the circuit element such that the circuit element is enclosed by the cover and the substrate, the cover attached to the substrate such that a water-tight seal is formed between the substrate and the cover;

dielectric liquid positioned within the cover, the dielectric liquid contacting the circuit element; and a porous media having a plurality of pores dimensioned to receive vapor from the dielectric liquid, the porous media positioned such that vapor from the dielectric liquid is received by the pores when the dielectric liquid boils, wherein the pores are dimensioned to prevent the dielectric liquid from entering the pores.

8. The cooling system of claim 7, wherein the porous media is positioned within the cover.

9. The cooling system of claim 8, wherein the porous media comprises liquid phase sintered (LPS) copper frit.

10. The cooling system of claim 7, wherein the porous media is positioned within the output tubing.

11. A cooling system for electronics, comprising:

a substrate;

a circuit element positioned on the substrate;

a cover positioned over the circuit element;

a dielectric liquid positioned within the cover and contacting the circuit element; and a dielectric liquid source, wherein the cover has an inlet for receiving the dielectric liquid from the dielectric liquid source, and wherein the cover has an outlet.

12. The cooling system of claim 11, wherein the cover is attached to the substrate.

13. The cooling system of claim 12, wherein the cover forms a water-tight seal between the cover and the substrate.

14. The cooling system of claim 11, further comprising a porous media having a plurality of pores dimensioned to accept vapor from the dielectric liquid, the media positioned such that vapor from the dielectric liquid is received by the pores and cooled by the porous media when the dielectric liquid boils.

15. The cooling system of claim 11, wherein the outlet is for permitting vapor from the dielectric liquid to exit the cover when the dielectric liquid boils.

16. The cooling system of claim 11, wherein the outlet is coupled to the dielectric liquid source.

17. A cooling system for electronics, comprising:

a substrate;

a circuit element positioned on the substrate;

a cover positioned over the circuit element;

a dielectric liquid positioned within the cover and contacting the circuit element; and a porous media having a plurality of pores dimensioned to accept vapor from the dielectric liquid, the media positioned such that vapor from the dielectric liquid is received by the pores and cooled by the porous media when the dielectric liquid boils, wherein the pores are dimensioned such that the dielectric liquid is prevented from passing through the porous media.

18. The cooling system of claim 17, wherein the porous media is positioned on the cover.

19. A cooling system for electronics, comprising:

a substrate;

a circuit element positioned on the substrate;

a cover positioned over the circuit element;

a dielectric liquid positioned within the cover and contacting the circuit element; and a porous media having a plurality of pores dimensioned to accept vapor from the dielectric liquid, the media positioned such that vapor from the dielectric liquid is received by the pores and cooled by the porous media when the dielectric liquid boils, wherein the porous media covers an outlet of the cover.

20. A method of cooling a circuit element, comprising:

providing a circuit element positioned upon a substrate and covered by a cover;

causing dielectric liquid to flow through an inlet of the cover such that the dielectric liquid contacts the circuit element;

emitting heat from the circuit element to the dielectric liquid contacting the circuit element, thereby causing the dielectric liquid to boil; and permitting vapor from the boiling dielectric liquid to exit the cover through an outlet of the cover.

21. The method of claim 20, further comprising receiving the vapor from the boiling dielectric liquid into pores of a porous media.

22. A method of cooling a circuit element, comprising:

providing a circuit element positioned upon a substrate and covered by a cover;

emitting heat from the circuit element to a dielectric liquid positioned within the cover and contacting the circuit element, thereby causing the dielectric liquid to boil; and receiving vapor from the boiling dielectric liquid into pores of a porous media, wherein the pores are dimensioned such that the dielectric liquid is prevented from passing through the porous media.

23. The method of claim 22, further comprising cooling the vapor via the porous media causing the vapor to condense.

24. The method of claim 22, wherein the porous media is positioned within the cover.

* * * * *